US011355505B2

(12) United States Patent
Morris et al.

(10) Patent No.: US 11,355,505 B2
(45) Date of Patent: Jun. 7, 2022

(54) VERTICAL BACKEND TRANSISTOR WITH FERROELECTRIC MATERIAL

(71) Applicant: INTEL CORPORATION, Santa Clara, CA (US)

(72) Inventors: Daniel H. Morris, Hillsboro, OR (US); Uygar E. Avci, Portland, OR (US); Ian A. Young, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 66 days.

(21) Appl. No.: 16/640,041

(22) PCT Filed: Sep. 29, 2017

(86) PCT No.: PCT/US2017/054594
§ 371 (c)(1),
(2) Date: Feb. 18, 2020

(87) PCT Pub. No.: WO2019/066963
PCT Pub. Date: Apr. 4, 2019

(65) Prior Publication Data
US 2020/0235110 A1 Jul. 23, 2020

(51) Int. Cl.
*H01L 27/11507* (2017.01)
*G11C 11/22* (2006.01)
*H01L 49/02* (2006.01)
(52) U.S. Cl.
CPC ...... *H01L 27/11507* (2013.01); *G11C 11/221* (2013.01); *H01L 28/90* (2013.01)

(58) Field of Classification Search
CPC ............... H01L 27/11507; H01L 28/90; H01L 29/78642; H01L 28/55; G11C 11/221
See application file for complete search history.

(56) References Cited

U.S. PATENT DOCUMENTS 6,140,672 A * 10/2000 Arita ................. H01L 21/76895
257/295
6,404,667 B1 6/2002 Yog
9,293,185 B2 3/2016 Gonzalez et al.
9,991,268 B1 * 6/2018 Liaw .................. H01L 27/1104
(Continued)

FOREIGN PATENT DOCUMENTS

JP 2001156265 6/2001
KR 100723398 3/2002
(Continued)

OTHER PUBLICATIONS

International Preliminary Report on Patentability from PCT/US2017/054594 dated Apr. 9, 2020, 7 pgs.
(Continued)

*Primary Examiner* — Jerome Leboeuf
(74) *Attorney, Agent, or Firm* — Essential Patents Group, LLP

(57) ABSTRACT

Techniques and mechanisms to provide a memory array comprising a 1T1C (one transistor and one capacitor) based memory cell. In an embodiment, the memory cell comprises a transistor, fabricated on a backend of a die, and a capacitor which includes a ferroelectric material. The transistor of the 1T1C memory cell is a vertical transistor. In another embodiment, the capacitor is positioned vertically over the transistor.

26 Claims, 9 Drawing Sheets

(56) References Cited

U.S. PATENT DOCUMENTS

| | | | |
|---|---|---|---|
| 2002/0085434 A1 | 7/2002 | Mandelman et al. | |
| 2002/0127801 A1 | 9/2002 | Kang | |
| 2003/0132470 A1* | 7/2003 | Joshi | H01L 23/642 |
| | | | 257/295 |
| 2010/0038743 A1 | 2/2010 | Lee | |
| 2010/0110758 A1* | 5/2010 | Li | H01L 45/122 |
| | | | 365/148 |
| 2012/0003808 A1 | 1/2012 | Lee | |
| 2013/0264620 A1 | 10/2013 | Yu et al. | |
| 2014/0009998 A1* | 1/2014 | Schloss | G11C 13/003 |
| | | | 365/148 |
| 2015/0249096 A1* | 9/2015 | Lupino | G11C 5/02 |
| | | | 257/203 |
| 2015/0364565 A1* | 12/2015 | Ramaswamy | H01L 27/11507 |
| | | | 257/295 |
| 2017/0162702 A1* | 6/2017 | Hu | H01L 29/775 |
| 2017/0200744 A1* | 7/2017 | Giles | H01L 21/845 |
| 2019/0027535 A1* | 1/2019 | Kumar | H01L 27/222 |

FOREIGN PATENT DOCUMENTS

| | | |
|---|---|---|
| KR | 20030069801 | 8/2003 |
| KR | 20090118967 | 11/2009 |
| KR | 20100053230 | 5/2010 |

OTHER PUBLICATIONS

International Search Report and Written Opinion from PCT/US2017/054594 dated Jun. 29, 2018, 11 pgs.

Extended European Search Report from European Patent Application No. 17927821.3 dated Mar. 17, 2021, 8 pgs.

Zubko, P. et al., "Ferroelectric Domains in PbTiO3/SrTiO3 Superlattices", Ferroelectrics, vol. 433, No. 1, Sep. 12, 2012, pp. 127-137.

* cited by examiner

VERTICAL BACKEND TRANSISTOR WITH FERROELECTRIC MATERIAL

CLAIM OF PRIORITY

This Application is a National Stage Entry of, and claims priority to, PCT Application No. PCT/US17/54594, filed on 29 Sep. 2017 and titled "VERTICAL BACKEND TRANSISTOR WITH FERROELECTRIC MATERIAL," which is incorporated by reference in its entirety for all purposes.

BACKGROUND

A memory requires sub-array circuits such as word-line (WL), bit-line (BL) drivers, row/column multiplexers, sense circuitry, and voltage generators in addition to memory cells that consume significant area. Increasing density of embedded memory is desirable to enable larger size memory in electronic chips thus higher performing products.

BRIEF DESCRIPTION OF THE DRAWINGS

The embodiments of the disclosure will be understood more fully from the detailed description given below and from the accompanying drawings of various embodiments of the disclosure, which, however, should not be taken to limit the disclosure to the specific embodiments, but are for explanation and understanding only.

DETAILED DESCRIPTION

Figure 1B:
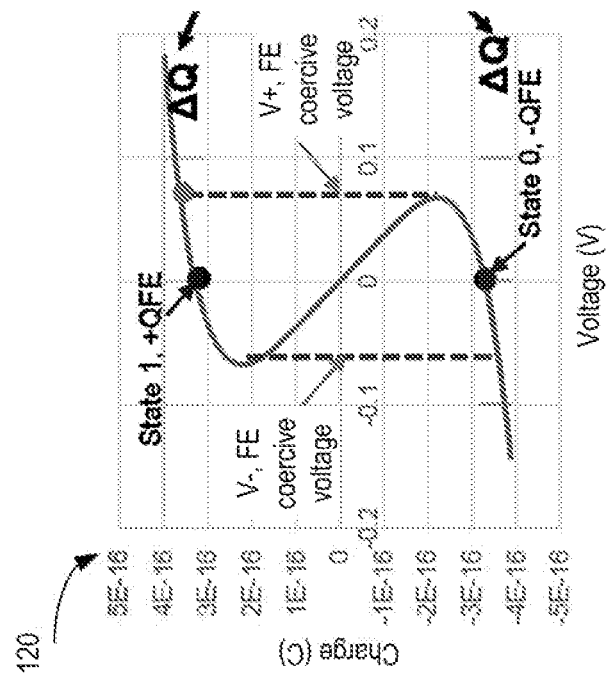
FIG. 1B illustrates a plot showing charge versus voltage function of the FE-Cap and its memory states.

Some embodiments describe a memory architecture that comprises a memory array having a 1T1C (one transistor and one capacitor) based memory bit-cells, where each bit-cell includes a backend transistor and ferroelectric capacitor. In various embodiments, peripheral circuits associated with the memory bit-cells are fabricated on the frontend of a die. In some embodiments, the access transistor of the 1T1C memory bit-cell is a vertical backend transistor.

Here, the term "backend" generally refers to a section of a die which is opposite of a "frontend" and where an IC (integrated circuit) package couples to IC die bumps. For example, high level metal layers (e.g., metal layer 6 and above in a ten metal stack die) and corresponding vias that are closer to a die package are considered part of the backend of the die. In another instance, a region of a die over and including the first metal layer is referred to as the backend region. Conversely, the term "frontend" generally refers to a section of the die that includes the active region (e.g., where transistors are fabricated) and low level metal layers and corresponding vias that are closer to the active region (e.g., metal layer 5 and below in the ten metal stack die example). In another example, a region of a die below the first metal layer is referred to as the frontend region.

There are many technical effects of various embodiments. For example, by using the vertical back-end transistor, source (S) and drain (D) of an access, transistor can be connected to upper and lower metal layers instead of consuming more area for lateral fit of S/D contact for a conventional lateral transistor. This enables smaller memory cell area. In some embodiments, the vertical back-end transistor enables routing of BL and SL at different sides of the access transistor MN. As such, layout congestion is reduced which enables more memory density. In some embodiments, the vertical structure of the vertical back-end transistor enables optimization of the memory structure to minimize WL to BL parasitic capacitance thus improving read signal to noise ratio.

The use of ferroelectric capacitor for the 1T1C memory bit-cell allows for longer retention time than regular capacitors. For example, by using a thin ferroelectric capacitor instead of conventional DRAM capacitor: retention time is increased thus refresh power is decreased significantly; either read signal can be increased or ferroelectric capacitor area/height can be scaled due to larger charge density of polarization of FE relative to conventional dielectrics capacitors; and strict leakage requirement for access transistor MN is removed. As such, in some cases, any transistor with relaxed leakage and threshold (Vt) levels can be used (e.g., up to 10 nA/um instead of strict approximately 1 pA/μm leakage levels).

By using backend transistors, conventional frontend transistors can be utilized for sub-array circuits improving total effective memory density; and ferroelectric capacitor can be fabricated at higher metal layers that are far away from critical dimension metal layers at lower levels. This also enables a taller a ferroelectric capacitor since metal heights are larger at the backend. Other technical effects will be evident from the various embodiments and figures.

In the following description, numerous details are discussed to provide a more thorough explanation of embodiments of the present disclosure. It will be apparent, however, to one skilled in the art, that embodiments of the present disclosure may be practiced without these specific details. In other instances, well-known structures and devices are shown in block diagram form, rather than in detail, in order to avoid obscuring embodiments of the present disclosure.

Note that in the corresponding drawings of the embodiments, signals are represented with lines. Some lines may be thicker, to indicate more constituent signal paths, and/or have arrows at one or more ends, to indicate primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

Throughout the specification, and in the claims, the term "connected" means a direct connection, such as electrical, mechanical, or magnetic connection between the things that are connected, without any intermediary devices.

The term "coupled" means a direct or indirect connection, such as a direct electrical, mechanical, or magnetic connection between the things that are connected or an indirect connection, through one or more passive or active intermediary devices.

The term "circuit" or "module" may refer to one or more passive and/or active components that are arranged to cooperate with one another to provide a desired function. The term "signal" may refer to at least one current signal, voltage signal, magnetic signal, or data/clock signal. The meaning of "a," "an," and "the" include plural references. The meaning of "in" includes "in" and "on."

The term "scaling" generally refers to converting a design (schematic and layout) from one process technology to another process technology and subsequently being reduced in layout area. The term "scaling" generally also refers to downsizing layout and devices within the same technology node. The term "scaling" may also refer to adjusting (e.g., slowing down or speeding up—i.e. scaling down, or scaling up respectively) of a signal frequency relative to another parameter, for example, power supply level. The term "scaling" may also refer to adjusting the magnitude of the power supply voltage (e.g., voltage scaling) to the circuit(s).

The terms "substantially," "close," "approximately," "near," and "about," generally refer to being within +/−10% of a target value. Unless otherwise specified the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

It is to be understood that the terms so used are interchangeable under appropriate circumstances such that the embodiments of the invention described herein are, for example, capable of operation in other orientations than those illustrated or otherwise described herein.

For the purposes of the present disclosure, phrases "A and/or B" and "A or B" mean (A), (B), or (A and B). For the purposes of the present disclosure, the phrase "A, B, and/or C" means (A), (B), (C), (A and B), (A and C), (B and C), or (A, B and C). The terms "left," "right," "front," "back," "top," "bottom," "over," "under," and the like in the description and in the claims, if any, are used for descriptive purposes and not necessarily for describing permanent relative positions.

For purposes of the embodiments, the transistors in various circuits, modules, and logic blocks may be Tunneling FETs (TFETs) or some transistors of various embodiments may comprise metal oxide semiconductor (MOS) transistors, which include drain, source, gate, and bulk terminals. The transistors may also include Tri-Gate and FinFET transistors, Gate All Around Cylindrical Transistors, Square Wire, or Rectangular Ribbon Transistors or other devices implementing transistor functionality like carbon nano tubes or spintronic devices. MOSFET symmetrical source and drain terminals i.e., are identical terminals and are interchangeably used here. A TFET device, on the other hand, has asymmetric Source and Drain terminals. Those skilled in the art will appreciate that other transistors, for example, Bi-polar junction transistors—BJT PNP/NPN, BiCMOS, CMOS, etc., may be used for some transistors without departing from the scope of the disclosure.

It is pointed out that those elements of a figure having the same reference numbers (or names) as the elements of any other figure can operate or function in any manner similar to that described, but are not limited to such.

Figure 1A:
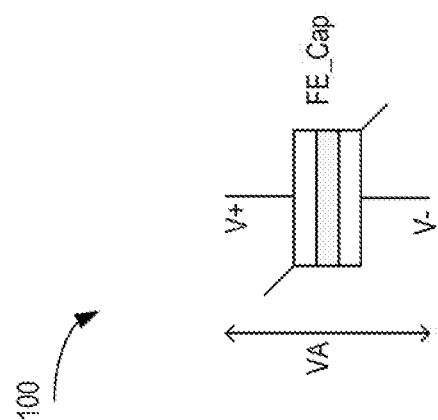
FIG. 1A illustrates a schematic of a ferroelectric capacitor (FE-Cap).

FIG. 1A illustrates schematic of a ferroelectric capacitor (FE-Cap) 100. FIG. 1B illustrates plot 120 showing charge versus voltage function of the FE-Cap, its memory states, and imprint charge. Unlike a normal dielectric based capacitor, a ferroelectric capacitor uses polarization charge to store the memory states, where positive and negative polarization charge indicates state "1" or "0". To switch an FE-cap, the applied FE-cap voltage VA is be higher than the ferroelectric coercive voltages (which behave as threshold voltages) when driven by a voltage source. For example, VA is greater than V+ for 0 to 1 state switching, and VA is less than V− for 1 to 0 state switching.

Figure 2:
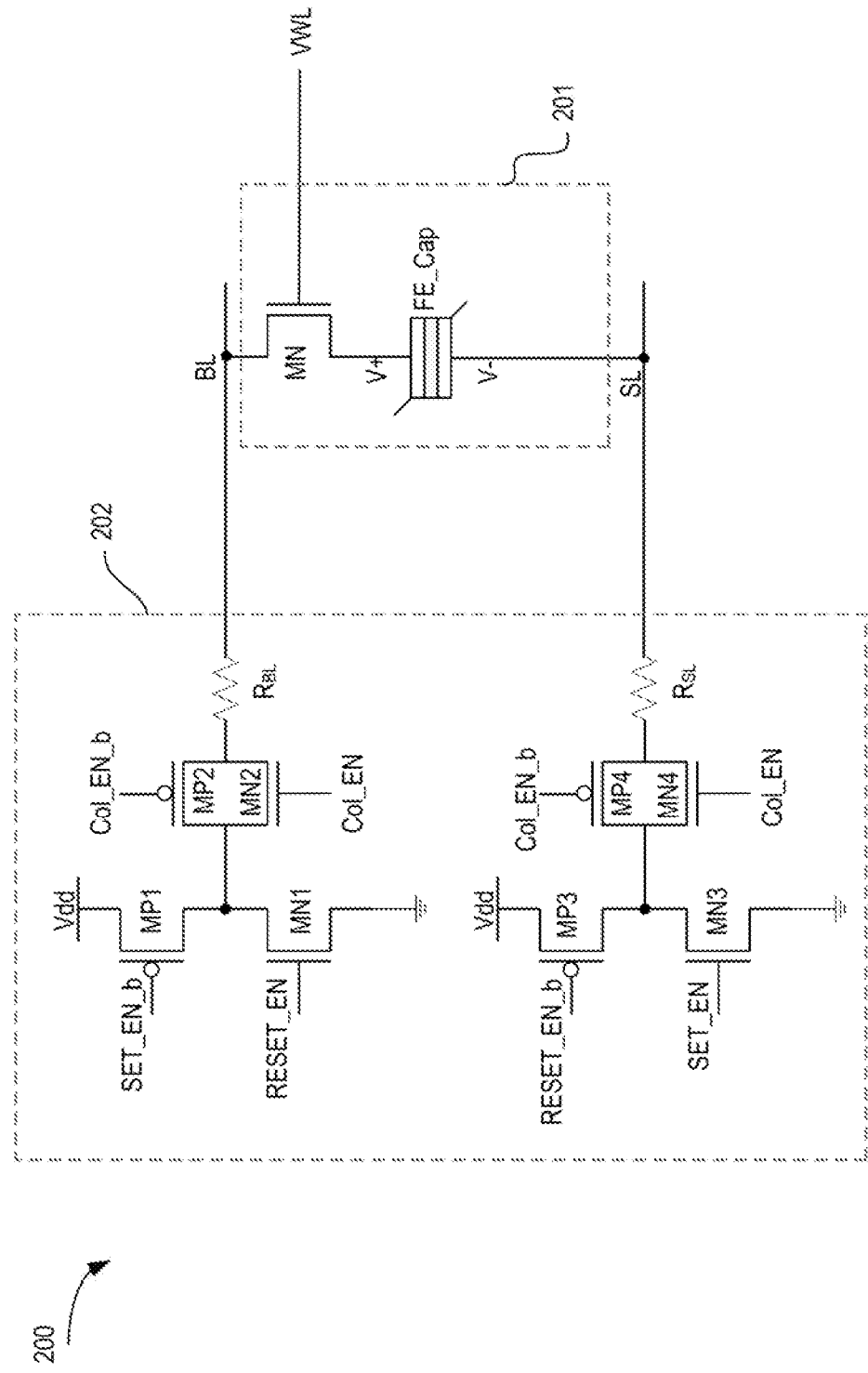
FIG. 2 illustrates a memory apparatus which comprises a voltage-based write driver for ferroelectric memory using a vertical backend transistor or backend transistor, in accordance with some embodiments.

FIG. 2 illustrates a memory apparatus 200 comprising a voltage-based write driver for a ferroelectric memory using a vertical backend transistor, in accordance with some embodiments. In this example, the memory cell 201 is a one transistor and one capacitor (1T1C) based memory cell which is driven by peripheral circuit 202. The memory cell comprises an access transistor MN controlled by word-line (WL) and FE_Cap coupled in series with the transistor MN. The voltage on WL is VWL. One of source/drain terminal of transistor MN is coupled to bit-line (BL) while one terminal of the FE_cap is coupled to a source line (SL) or select line, also referred to as plate-line. Voltages on BL and SL are controlled by a write driver which is part of peripheral circuit 202. In this example, the write driver comprises a BL driver which includes p-type transistor MP1 and n-type transistor MN1, and a SL driver which includes p-type transistor MP3 and n-type transistor MN3, first column multiplexer comprising p-type transistor MP2 and n-type transistor MN4, second column multiplexer comprising p-type transistor MP4 and n-type transistor MN2, BL resistor $R_{BL}$, and SL resistor $R_{SL}$. The BL and SL drivers are controlled by SET_EN (set enable signal) and RESET_EN (reset enable signal) and their complementary signals SET_EN_b and RESET_EN_b, respectively. The first and second column multiplexers are controlled by Col_EN and its complimentary Col_EN_b.

During SET operation, WL is high, RESET_EN is low and SET_EN is high, and first and second column multiplexers are on (e.g., Col_EN is high). As such, transistor MP1 is on and BL is charged to VDD (power supply level) and transistor MN3 is on causing SL to be discharged to ground. A charge is applied to the FE-cap to flip the state of the FE-cap. The state of the FE_Cap during SET operation is '1' because the charge on the FE_Cap is greater than zero.

During RESET operation, WL is high, RESET_EN is high and SET_EN is low, and first and second column multiplexers are on (e.g., Col_EN is high). As such, transistor MN1 is on and BL is discharged to ground and transistor MP3 is on causing SL to be charged to power supply (VDD). The state of the FE_Cap during RESET operation is '0' because the charge on the FE_Cap is less than zero.

In various embodiments, transistor MN of memory cell 201 is a vertical backend transistor which allows for significantly better memory properties than conventional 1T1C transistors such as embedded dynamic random access memory (eDRAM). The use of FE_Cap allows for longer retention time than regular capacitors. For example, by using a thin ferroelectric capacitor instead of conventional DRAM capacitor: retention time is increased, thus refresh power is decreased significantly; either read signal can be increased or capacitor (COB) area/height can be scaled due to larger charge density of polarization of FE relative to conventional dielectrics capacitors; and strict leakage requirement for access transistor MN is removed. As such, in some cases, any transistor with relaxed leakage and threshold (Vt) levels can be used (e.g., up to 10 nA/um instead of strict approximately 1 pA/μm leakage levels).

In some embodiments, access transistor MN is a backend transistor as opposed to a frontend transistor. By using backend transistors, conventional frontend transistors can be utilized for sub-array circuits improving total effective memory density; and ferroelectric capacitor (FE_Cap) can be fabricated at higher metal layers that are far away from critical dimension metal layers at lower levels. This also enables taller FE_Cap since metal heights are larger at the backend. As FE_Cap height increases, more charge can be stored.

In some embodiments, access transistor MN is a vertical backend transistor. By using the vertical backend transistor, source (S) and drain (D) of access transistor can be connected to upper and lower metal layer instead of consuming more area for lateral fit of S/D contact for conventional lateral transistors. This enables smaller memory cell area. In some embodiments, vertical backend transistor enables routing of BL and SL at different sides of the access transistor MN. As such, layout congestion is reduced which enables more memory density. In some embodiments, the vertical structure of the vertical backend transistor enables optimization of structure to minimize WL to BL parasitic capacitance thus improving read signal to noise ratio.

Figure 3:
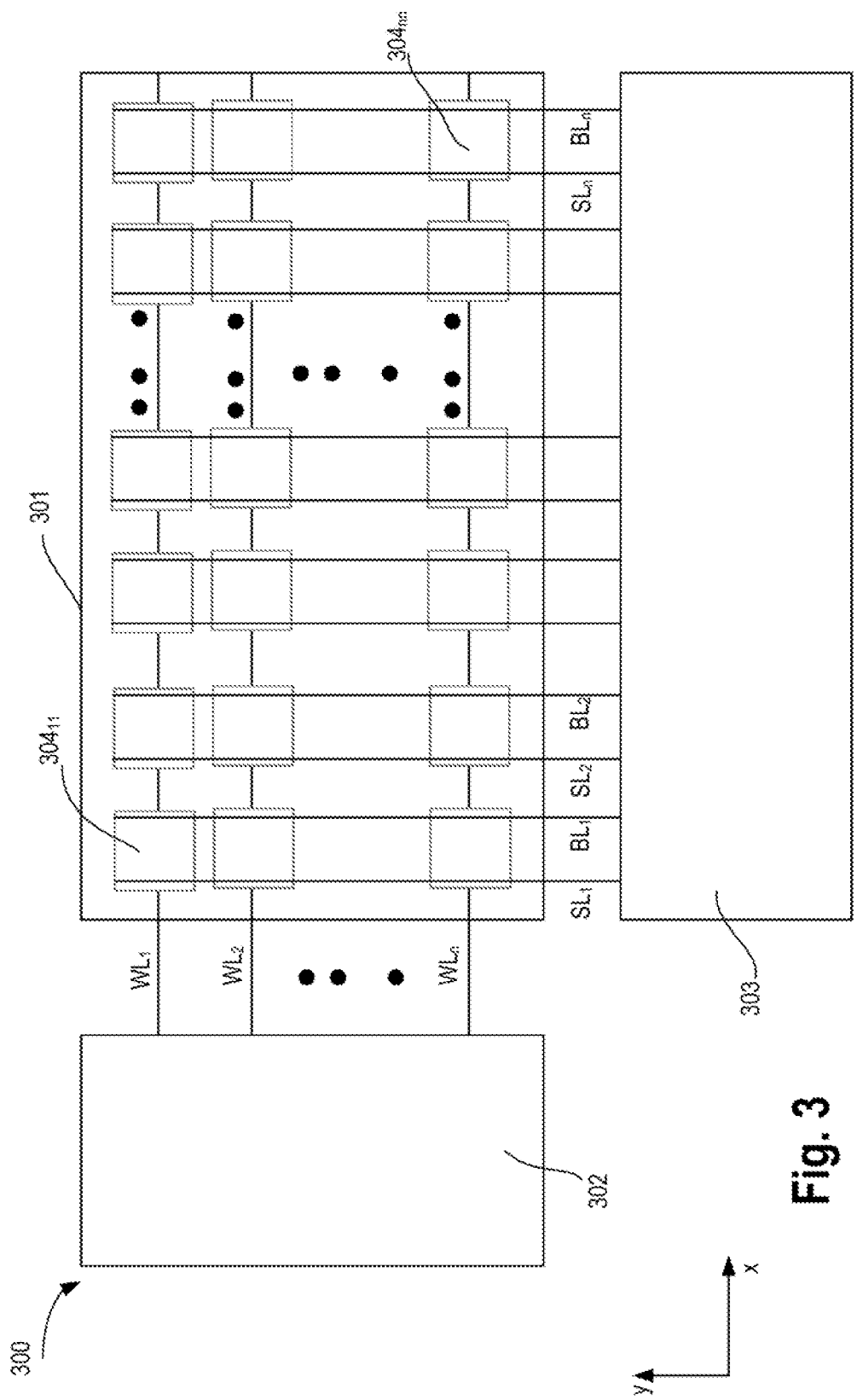
FIG. 3 illustrates a memory architecture having ferroelectric memory cells comprising vertical backend transistor or backend transistor, and peripheral circuits fabricated on a frontend of a die, in accordance with some embodiments.

FIG. 3 illustrates a memory architecture 300 having ferroelectric memory cells comprising vertical backend transistor or backend transistor, and peripheral circuits fabricated on a frontend of a die, in accordance with some embodiments. Memory architecture 300 comprises memory array 301, word-line drivers 302, bit-line/source-line drivers 303, word-lines $WL_{1-n}$, bit-lines $BL_{1-n}$, and source lines $SL_{1-n}$. For sake of simplicity other circuitries are not shown, but a person skilled in the art would appreciate a memory architecture includes other circuitries such as sense amplifiers, column multiplexers, etc. In some embodiments, word-line drivers 302 and bit-line/source-line drivers 303 are fabricated on the frontend of the die while memory array 301 is fabricated on the backend of the die. In various embodiments, memory array 301 comprises memory cells $304_{11}$ to $304_{nn}$ (where 'n' is a number greater than 1) organized as row and columns, and where memory cells $304_{11}$ to $304_{nn}$ comprise access transistors (e.g., vertical backend transistor or backend transistor) and ferroelectric capacitors. In some embodiments, the peripheral circuits (e.g., 302 and 303) are positioned below memory array 301 because the peripheral circuits are fabricated on the frontend of the die while the memory array 301 is fabricated on the backend of the die. In some embodiments, $WL_{1-n}$, $SL_{1-n}$, and $BL_{1-n}$ are routed vertically from peripheral circuits to memory array 301. As such, the memory footprint in the x-y dimension is reduced because the peripheral circuits are under memory array 301.

Figure 4:
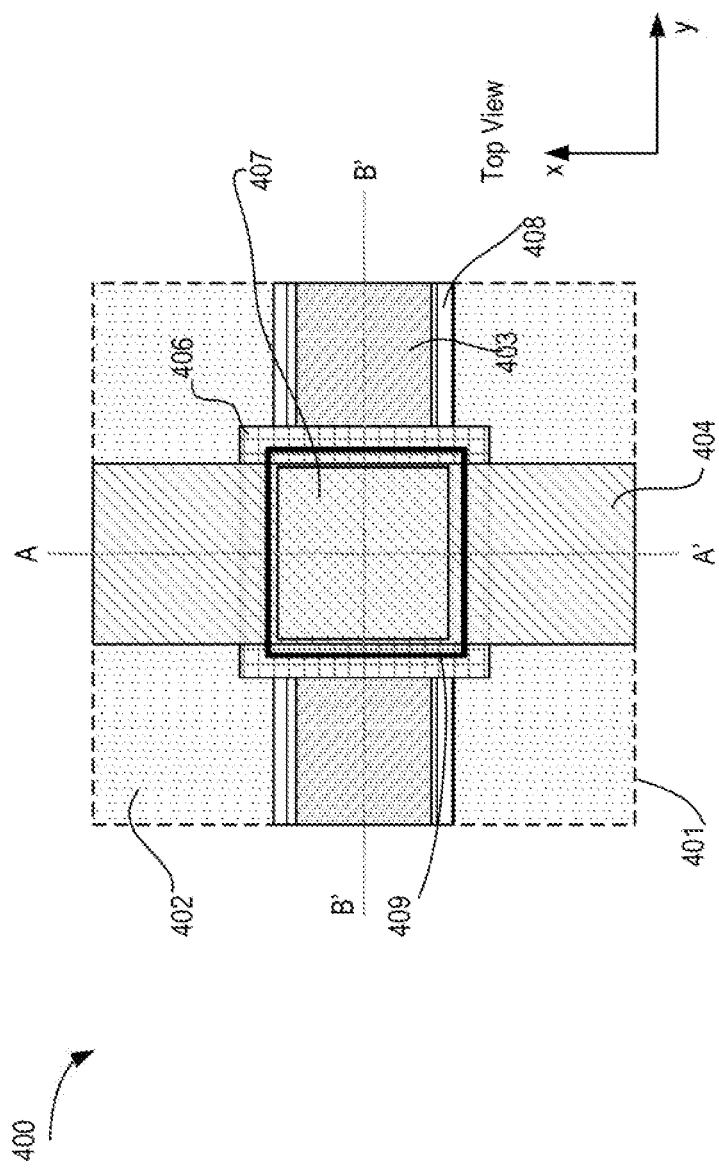
FIG. 4 illustrates a top view of a ferroelectric memory cell comprising vertical backend transistor or backend transistor, in accordance with some embodiments.

FIG. 4 illustrates a top view 400 of ferroelectric memory cell comprising vertical backend transistor or backend transistor, in accordance with some embodiments. Top view 400 illustrates the footprint (pitch) 401 of memory cell, insulating material 402 (e.g., $SiO_2$), bit-line 403, word-line 404, source-line 408 (also referred to as the plate-line), bottom contact 407, top contact 406, and opening 409 for the ferroelectric capacitor. There may be a via (not shown) connecting to the bottom contact 407, and the via may have the same size and shape as the bottom contact 407 in accordance with some embodiments. In some embodiments, the surface area of the via in contact with bottom contact 407 is smaller than the surface area of bottom contact 407 in touch with the via. In some embodiments, bottom contact 407 is a transistor contact. In some embodiments, bit-line 403 can be used to define channel material pattern. In some embodiments, top contact 406 is the contact for the ferroelectric capacitor. In various embodiments, source-line 408 runs perpendicular or orthogonal to bit-line 403. In some embodiments, source-line 408 runs parallel to bit-line 403. While the top contact 406 is shown larger than the bottom contact 405, the two contacts can have the same size or the bottom contact 407 can be larger than the top contact 406, in accordance with some embodiments. In some embodiments, the ferroelectric capacitor and access transistor are formed under the bottom contact 407. Cross-sectional views along cuts AA' and BB' are illustrated in FIGS. 5A-B, respectively.

Figure 5:
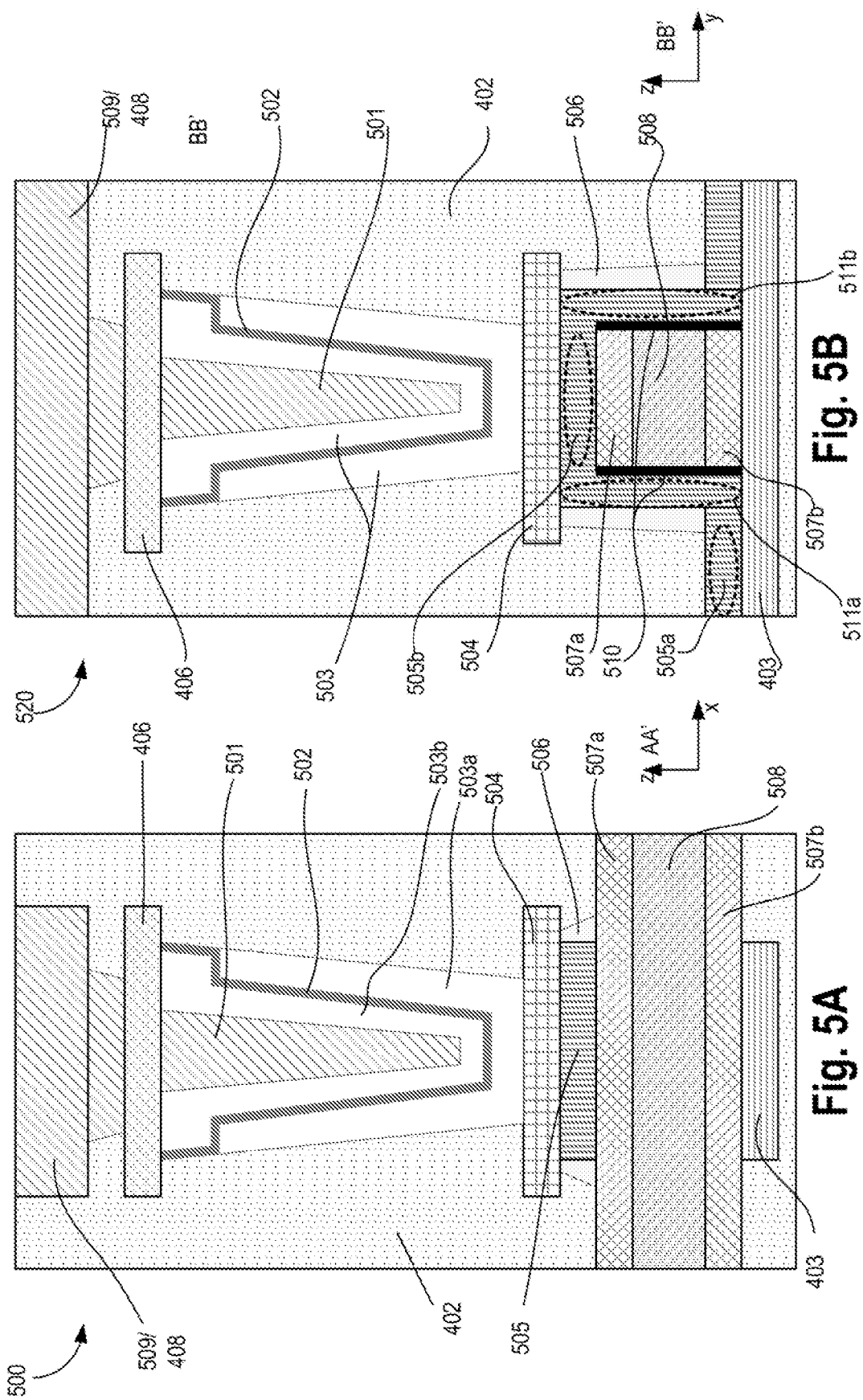
FIG. 5A illustrates a cross-section of the ferroelectric memory cell of FIG. 4, in accordance with some embodiments.
FIG. 5B illustrates another cross-section of the ferroelectric memory cell of FIG. 4, in accordance with some embodiments.

FIG. 5A illustrates a cross-section 500 along the cut AA' of the ferroelectric memory cell of FIG. 4, in accordance with some embodiments. The following layers are described from the bottom up. The bit-line 403 is formed at the bottom in this configuration. In some embodiments, bit-line 403 comprises metal (e.g., one or more of: TiN, TaN, N, Ta, W, Ag, Au, Al, Co, Cu, or Graphene). Bit-line 403 is formed on the backend of die. For example, bit-line 403 is formed in metal layer 5 (M5). The access transistor MN is then formed over bit-line 403. Here, layers 507a/b are spacers while layer 508 is the gate between the spacers. In some embodiments, spacers 507a/b comprise $SiO_2$ or nitrides. In some embodiments, gate 508 is a metal or a highly doped poly silicon. For example, 1e20 to 1e21 doping per $cm^3$ can be used for gate 508. The gate 508 is coupled to word-line, in accordance with various embodiments. In some embodiments, layer 505 above spacer 507a is the channel material in the drain region of the transistor. In some embodiments, the channel is the vertical part next to the very dark vertical line. The dark vertical line is the gate oxide, in accordance with some embodiments. Materials for the drain can be doped semiconductor materials such as n-doped or p-doped GaN, GaAs, and other III-V semiconductor materials. Materials for the drain may also include Amorphous Silicon, Polysilicon, Amorphous or poly III-V materials, Amorphous or Poly Ge, IGZO (indium gallium zinc oxide), Zinc Oxide, TMD (Transition Metal Dichalcogenide) materials (e.g., $MoS_2$, $MoSe_2$, $MoTe_2$, $WS_2$, $WSe_2$, $WTe_2$), or Graphene.

The region of the 505 on the edges is the channel region, in accordance with some embodiments. The material for the channel can be any transistor material such as GaN, GaAs, and other III-V semiconductor materials. Materials for the channel may also include Amorphous Silicon, Polysilicon, Amorphous or poly III-V materials, Amorphous or Poly Ge, IGZO (indium gallium zinc oxide), Zinc Oxide, TMD materials ($MoS_2$, $MoSe_2$, $MoTe_2$, $WS_2$, $WSe_2$, $WTe_2$), or Graphene. In some embodiments, channel 505 is surrounded by interlayer dielectric (ILD) 506 such as SiO$_2$, fluorine-doped SiO$_2$, carbon-doped SiO$_2$, porous SiO$_2$, porous carbon-doped SiO$_2$, spin-on organic polymeric dielectrics (e.g., polyimide, polynornornenes, or benzocuclobutene); or spin-on silicon based polymeric dielectric (e.g., hydrogen silses-quioxane and methylsilsesquioxane). In some embodiments, layer 504 is the protective oxide next to transistor channel.

In some embodiments, the layer adjacent to the drain 505 is the bottom contact 504 or the landing metal plate for the ferroelectric capacitor. In some embodiments, the landing metal plate is also coupled to a drain contact of a transistor. Any suitable material can be used for the bottom contact 504. For example, materials such as TiN, TaN, N, Ta, W, Au, Al, Cu, Ag, Co, or Graphene can be used for bottom contact 504 (same as 405). In some embodiments, ferroelectric capacitor is formed over the bottom contact 504. The layer 503a adjacent to the bottom contact 504 is the bottom electrode while the layer 503b is another portion of the bottom electrode for the capacitor. In some embodiments, bottom electrode 503a comprises a conductive oxide. In some embodiments, bottom electrode 503a comprises a material which includes one of: TiN, TaN, Ta, W, Ag, Au, Al, Co, Cu, Graphene, Sr, Ru, La, Sr, Mn, Nb, Cr, or O. In some embodiments, bottom electrode 503a comprises a material which includes one of: SrRuO$_3$, (La,Sr)CoO$_3$ [LSCO], La$_{0.5}$Sr$_{0.5}$Mn$_{1-x}$Ni$_x$O, Cu-doped SrFe$_{0.9}$Nb$_{0.1}$O$_3$, or (La,Sr)CrO$_3$.

In some embodiments, the thin layer 502 (e.g., 40 Angstroms (A) to 150 A of HfZrO$_2$ (HZO)) between 503a/b is the ferroelectric material, in accordance with some embodiments. In some embodiments, the thickness of layer 502 is in the range of 40 Angstroms (A) to 500 A. In some embodiments, the ferroelectric material includes one of: Ti, Hf, Zr, Al, Nb, La, Sr, or O. In some embodiments, ferroelectric material includes one of: TiAl, Nb doped SrTiO$_3$ (STO), La doped STO, SrTiO$_3$, BiFeO$_3$ (BFO) BiTeO$_3$, BaTiO$_3$, HfZrO$_2$ (HZO), silicon doped hafnium, PZT, SBT, SBO, BFT. In some embodiments, thickness of PZT, SBT, SBO, BFO, BFT is in the range of 40 A to 500 A. In some embodiments, ferroelectric material includes a super lattice of PbTiO$_3$ (PTO) and SrTiO$_3$ (STO). In some embodiments, the super lattice of PTO and STO is repeated in a range of 2 to 100 times. For examples, alternating layers of PTO and STO are repeated 2 to 100 times.

In some embodiments, the top electrode 501 is further coupled to another metal to connect the top contact 406. Any suitable material can be used for the top contact 406. For example, materials such as TiN, TaN, N, Ta, W, Au, Al, Cu, Ag, Co, or Graphene can be used for bottom contact 406. In some embodiments, bottom electrode 503b comprises a conductive oxide. In some embodiments, top electrode 501 comprises a material which includes one of: TiN, TaN, N, Ta, W, Au, Al, Cu, Ag, Co, Graphene, Sr, Ru, La, Sr, Mn, Nb, Cr, or O. In some embodiments, bottom electrode 503b comprises a material which includes one of: SrRuO$_3$, (La, Sr)CoO$_3$ [LSCO], La$_{0.5}$Sr$_{0.5}$Mn$_{1-x}$Ni$_x$O, Cu-doped SrFe$_{0.9}$Nb$_{0.1}$O$_3$, or (La,Sr)CrO$_3$.

The top contract 406 is then coupled to the plate-line 509, also referred to as the source or select-line, via metal 501 or top electrode 501 (e.g., TiN, TaN, N, W, Au, Al, Cu, Ag, Co, or Graphene). Any suitable material can be used for the plate-line 509/408. For example, materials such as Ta, TiN, TaN, N, W, Au, Al, Cu, Ag, Co, or Graphene can be used for plate-line 509.

In some embodiments, layer 403 is on metal layer 4 (M4), layers 507b, 508, 507a, 505 and 504 are formed thru metal layer 5 (M5). In some embodiments layers 503a, 502, 503b, 501 and 406 are formed through metal layer 6 (M6) to metal layer 7 (M7). In this example, the memory transistor is formed in M5 and the memory capacitor is formed in M6 and M7.

FIG. 5B illustrates another cross-section 520, this time along cut BB', of the ferroelectric memory cell of FIG. 4, in accordance with some embodiments. So as not to obscure the embodiments, same layers are not repeated. Here, the dark vertical lines 510 adjacent to gate 508 and spacers 507a/b are the gate oxide. The regions 511a/b on either side of gate oxide 510 is the channel region. The region/layer 505a is the source region while region/layer 505b is the drain region, in accordance with some embodiments. As illustrated by the cross-sections of FIGS. 5A-B, the transistor is a vertical transistor extending along the z-axis instead of the traditional x-direction. By configuring the transistor in the vertical direction, the pitch of a memory bit-cell in the x-y plane is reduced allowing more bit-cells to be packed along the x-y plane of the die.

Figure 6:
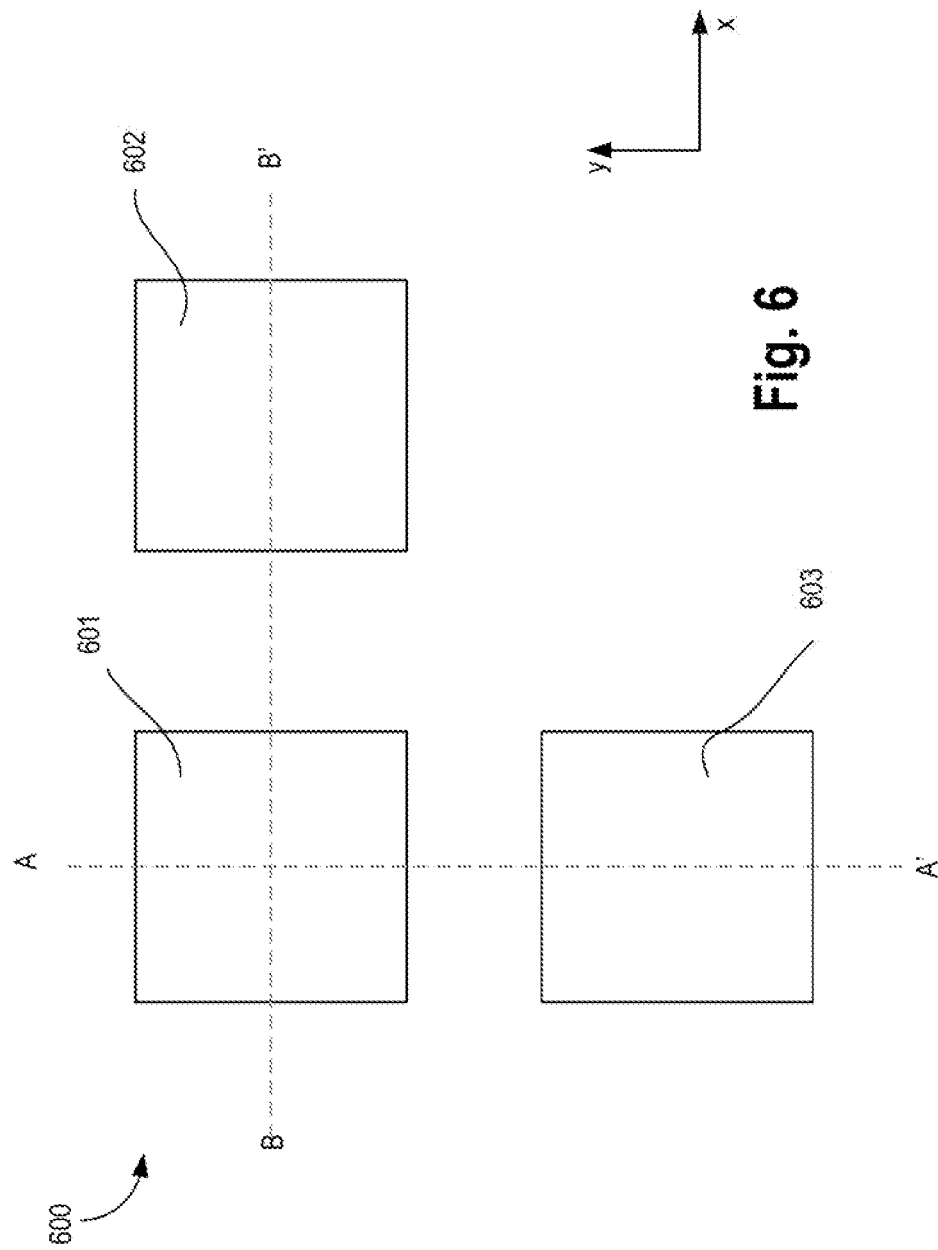
FIG. 6 illustrates a top view of ferroelectric memory cells comprising vertical backend transistor or backend transistors, where the transistors are fabricated below their respective ferroelectric capacitors, in accordance with some embodiments.

FIG. 6 illustrates a top view 600 of ferroelectric memory cells comprising vertical backend transistor or backend transistors, where the transistors are fabricated below their respective ferroelectric capacitors, in accordance with some embodiments. In this example, three memory bit-cells 601, 602, and 603 are shown.

Cross-sections AA' and BB' show the alternative embodiment of configuring the ferroelectric capacitor below the access transistor while still enabling a vertical transistor, in accordance with some embodiments. In some embodiments, when device properties of a transistor are sensitive to heat (e.g., during fabrication or during operation), moving the transistor away from the frontend may reduce the heat signature. For example, the optimum thermal process for fabricating the ferroelectric capacitor may be higher than the thermal process for fabricating a transistor. In one such case, the transistor can be fabricated over the ferroelectric capacitor to protect the transistor from high thermal exposure of the ferroelectric capacitor. In some embodiments, when device properties of a transistor are not that sensitive to heat (e.g., during fabrication or during operation), the transistor can be fabricated with the ferroelectric capacitor above it as shown with reference to FIGS. 5A-B.

Figure 7:
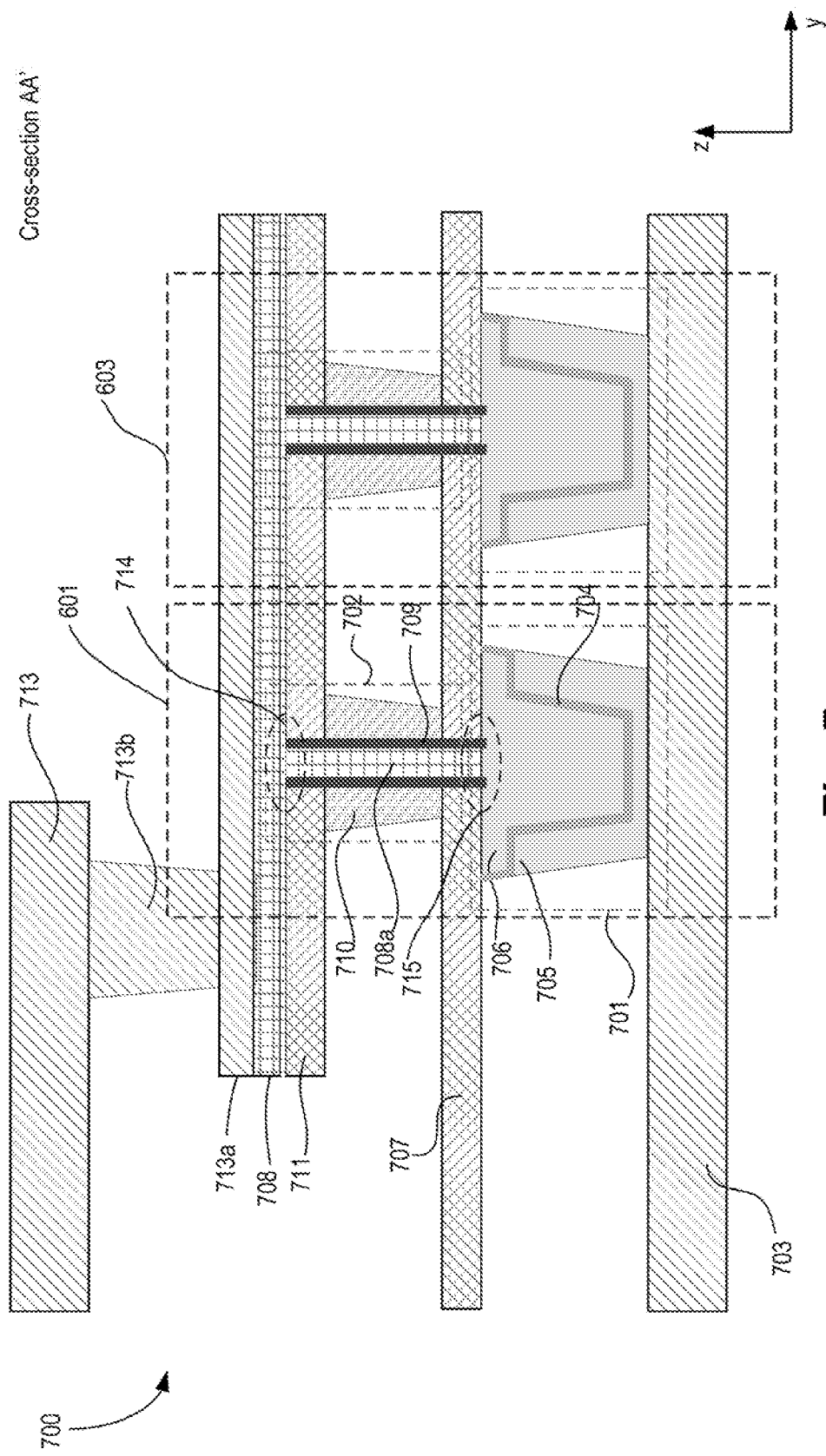
FIG. 7 illustrates a cross-section of the ferroelectric memory cell of FIG. 6, in accordance with some embodiments.
Figure 8:
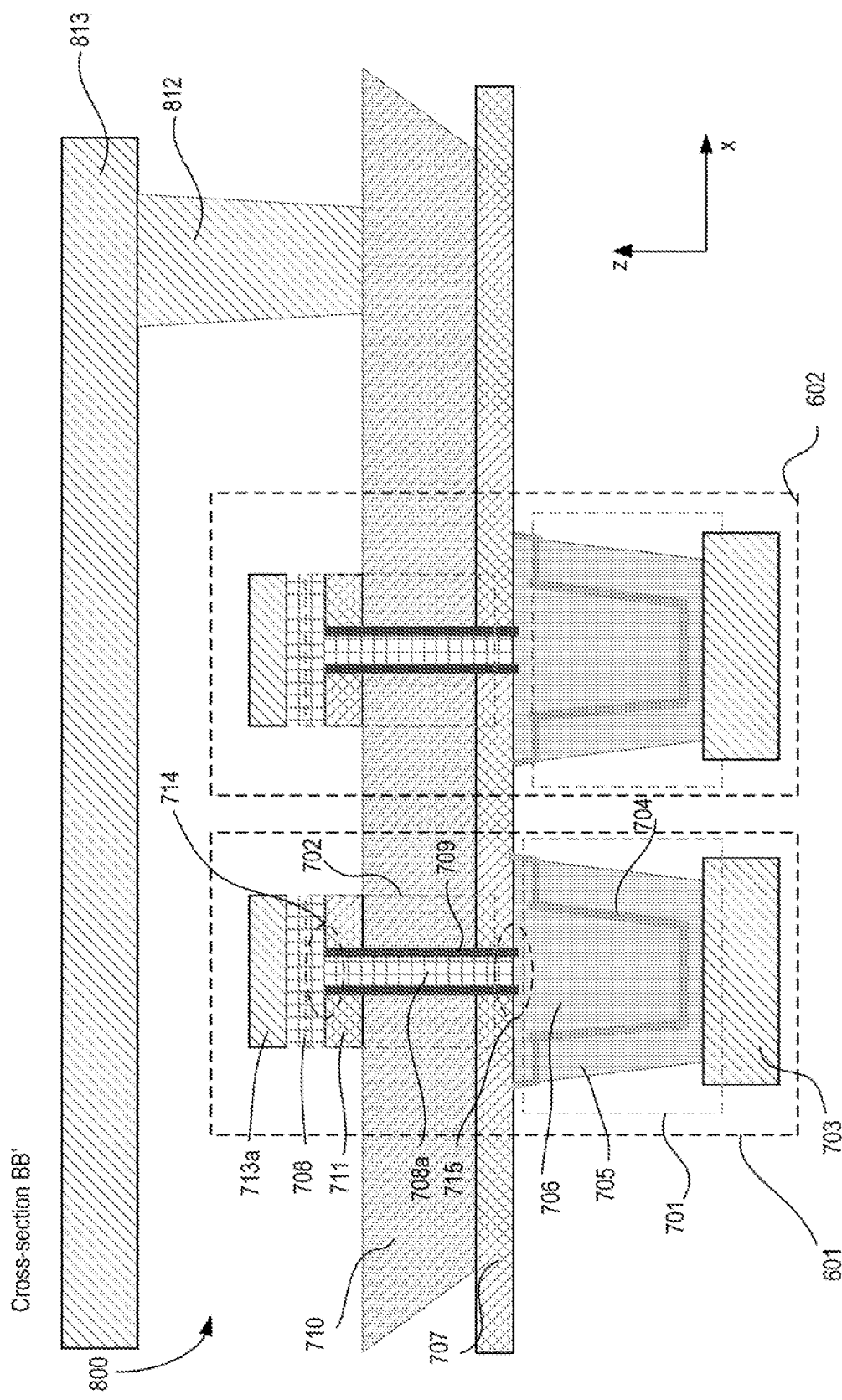
FIG. 8 illustrates another cross-section of the ferroelectric memory cell of FIG. 6, in accordance with some embodiments.

In some embodiments, the transistors of FIGS. 7-8 are implemented as a nanowire (or gate-all-around) transistor. In a nanowire transistor, the gate surrounds all the nanowires which improves the ability of the transistor to control the flow of current. Nanowires also allow for fabricating shorter gates without loss of control on the current through the channel.

FIG. 7 illustrates cross-section 700 (along cut AA') of the ferroelectric memory cell of FIG. 6, in accordance with some embodiments. Compared to FIG. 5A, here, the memory cell is flipped vertically in that transistor 702 is above the ferroelectric capacitor 702.

The following layers are described from bottom up. Layer 703 is a metal layer which functions as the plate-line (or source line) in this configuration. In some embodiments, plate-line 703 comprises metal (e.g., one or more of: Ta, W, Ag, Au, Al, Co, Cu, or Graphene). Plate-line 703 is formed on the backend of die. For example, Plate-line 703 is formed in metal layer 3 (M3). The ferroelectric capacitor 701 is then fabricated over bit-line 703, in accordance with some embodiments.

In some embodiments, layer 705 is a metal forming the bottom electrode of the ferroelectric capacitor 701 and is coupled to plate-line 703. Same materials as discussed with reference to FIGS. 5A-B for bottom contact can be used for layer 705, in accordance with some embodiments. For example, materials such as Ta, TaN, W, Au, Al, Cu, Ag, Co, Ti, TiN or Graphene can be used for bottom electrode 706.

In some embodiments, bottom electrode 705 comprises a conductive oxide. In some embodiments, top electrode 503b comprises a material which includes one of: TiN, TaN, N, Ta, W, Au, Al, Cu, Ag, Co, Graphene, Sr, Ru, La, Sr, Mn, Nb, Cr, or O. In some embodiments, bottom electrode 705 comprises a material which includes one of: $SrRuO_3$, (La,Sr)$CoO_3$ [LSCO], $La_{0.5}Sr_{0.5}Mn_{1-x}Ni_xO$, Cu-doped $SrFe_{0.9}Nb_{0.1}O_3$, or (La,Sr)$CrO_3$.

In some embodiments, layer 705 is coupled to layer 704, where layer 706 is the top contact for the ferroelectric capacitor 701. Any suitable metal can be used for layer 706. For example, materials such as Ta, W, Au, Al, Cu, Ag, Co, or Graphene can be used for bottom contact 706.

In some embodiments, ferroelectric material 704 is formed over the bottom contact 705. In some embodiments, ferroelectric material 704 is a thin layer (e.g., 85 Angstroms of $HfZrO_2$ (HZO)) between layers 705 and 716. In some embodiments, the thickness of layer 704 is in the range of 50 Angstroms (A) to 110 A. In various embodiments, layer 706 is the top electrode of the ferroelectric capacitor 701. Any suitable material can be used for the top electrode 706. For example, materials such as TiN, TaN, N, Ta, W, Au, Al, Cu, Ag, Co, or Graphene can be used for top electrode 706. In some embodiments, top electrode 706 comprises a conductive oxide. In some embodiments, top electrode 706 comprises a material which includes one of: Sr, Ru, La, Sr, Mn, Nb, Cr, or O. In some embodiments, top electrode 706 comprises a material which includes one of: $SrRuO_3$, (La,Sr)$CoO_3$ [LSCO], $La_{0.5}Sr_{0.5}Mn_{1-x}Ni_xO$, Cu-doped $SrFe_{0.9}Nb_{0.1}O_3$, or (La,Sr)$CrO_3$.

The layer 707 adjacent to the bottom contact 707 is a dielectric layer such as an interlayer dielectric (ILD). Common materials for ILD 707 include: SiO2, fluorine-doped SiO2, carbon-doped SiO2, porous SiO2, porous carbon-doped SiO2, spin-on organic polymeric dielectrics (e.g., polymide, polynornornenes, or benzocuclobutene); or spin-on silicon based polymeric dielectric (e.g., hydrogen silsesquioxane and methylsilsesquioxane).

In some embodiments, ferroelectric material 704 includes one of: Ti, Hf, Zr, Al, Nb, La, Sr, or O. In some embodiments, ferroelectric material includes one of: TiAl, Nb doped $SrTiO_3$ (STO), La doped STO, $SrTiO_3$, $BiFeO_3$ (BFO) $BiTeO_3$, $BaTiO_3$, $HfZrO_2$ (HZO). In some embodiments, ferroelectric material includes a super lattice of $PbTiO_3$ (PTO) and $SrTiO_3$ (STO).

In various embodiments, the transistor 702 is a nanowire. In this illustration, a single nanowire is shown having channel 708a surrounded by gate 709. In some embodiments, channel 708a of the nanowire (here, channel is also referred to as nanowire) is crystalline with much greater long-range order than a polycrystalline material. In some embodiments, channel region formed by the nanowire is substantially a single crystalline. A person skilled in the art would appreciate that while single crystalline nanowires may be referred to as monocrystalline, a low level of crystal defects may nevertheless be present as artifacts of an imperfect epitaxial growth process. In some embodiments, the channel is poly-crystalline. In some embodiments, the channel is amorphous.

Materials for the transistor 702 channel and/or source drain may include Amorphous Silicon, Polysilicon, Amorphous or poly III-V materials, Amorphous or Poly Ge, IGZO (indium gallium zinc oxide), Zinc Oxide, TMD materials (e.g., $MoS_2$, $MoSe_2$, $MoTe_2$, $WS_2$, $WSe_2$, $WTe_2$), or Gra-phene. In some embodiments, nanowire 708a includes one or more of: Si, Ge, Ga, As, In, N, or P. In some embodiments, nanowire 708a is an n-type nanowire or a p-type nanowire. In some embodiments, when nanowire 708a is a p-type nanowire, it comprises germanium (Ge). Germanium has high hole mobility and lattice parameters that is sufficiently matched to some group III-V semiconductor materials for good quality epitaxial stacks of Ge layers and group III-V semiconductor layers. In some embodiments, p-type nanowire 708a is composed of a group IV alloy (e.g., SiGe) or composed of silicon.

In some embodiments, when nanowire 708a is an n-type nanowire, it comprises a group III-V semiconductor material. In some embodiments, when an n-type nanowire comprises of germanium, the n-type nanowire comprises of GaAs. In some embodiments, the n-type nanowire 708a includes one or more of: InAs, a group III-N (e.g., GaN), InP, a ternary alloy comprising GaAs, a ternary alloy comprising InAs, a ternary alloy comprising InP, or a ternary alloy comprising a group III-N, or a quaternary alloy comprising GaAs, a quaternary alloy comprising InAs, a quaternary alloy comprising InP, or a quaternary alloy comprising a group III-N. In some embodiments, the channel region 708a in both the p-type nanowire and n-type nanowires is substantially undoped for the highest carrier mobility. For simplicity, one nanowire is shown. However, in some embodiments, more than one nanowires can be fabricated in a stack, and in some embodiments, multiple stacks can be formed in parallel for the same nanowire device (or transistor).

In some embodiments, layer 710 adjacent to the vertical gate oxide 709 is a metal which is coupled to the word-line. Any suitable metal can be used for layer 710. For example, materials such as Ta, W, Au, Al, Cu, Ag, Co, or Graphene can be used for layer 710.

Here, regions 714 and 715 form the source and drain regions, respectively of transistor 702. In some embodiments, source region 715 is coupled to the top electrode 704 of ferroelectric capacitor 701. In some embodiments, the drain region 714 is coupled to layer 708 which is then coupled to layer 713 through layers 713a (e.g., metal layer) and 713b (e.g., via). In some embodiments, layers 713, 713a/b comprise metal. In some embodiments, layer 713 is the plate-line (or source-line). Any suitable material can be used for the layers 713, 713a/b. For example, materials such as Ta, TiN, TaN, W, Au, Al, Cu, Ag, Co, or Graphene can be used for layers 713, 713a/b.

In some embodiments, the drain/source regions 714 and 715 comprise the same semiconductor material present in the channel region for the respective p-type and n-type nanowire 708a, but the source and drain regions further include a higher concentration of dopant. In some embodiments, the p-type nanowire source/drain region comprises a high p-type impurity (e.g., P+ dopant) while the n-type nanowire source/drain region comprises a high n-type impurity (e.g., N+ dopant). In some embodiments, the drain and source regions (714 and 715) maintain the same monocrystallinity as within the channel region of the nanowires 702a. The source/drain contacts may further include an epitaxially grown semiconductor of different composition than the nanowires 708a. For example, a p+ layer wrapping around the source region of the nanowire may provide an ultra-steep turn on and off (e.g., improved sub-threshold performance). As another example, in-situ doped semiconductor may be grown completely around the released source/drains for lower contact resistance.

In some embodiments, layer 711 is a spacer layer. In some embodiments spacer 711 is a low-K dielectric. Low-K dielectrics are materials with dielectric constants that are smaller than dielectric constants of Silicon Dioxide ($SiO_2$). In some embodiments, material for spacer 711 includes one or more of nitrides, fluorine-doped silicon dioxide, carbon-doped silicon dioxide, porous silicon dioxide, porous carbon-doped silicon dioxide, spin-on organic polymeric dielectrics (e.g., polyimide, polynorbornenes, benzocyclobutene, etc.), or spin-on silicon polymeric dielectrics (e.g., hydrogen silsesquioxane, methylsilsesquioxane, etc.). In some embodiments, layer 707 is a spacer layer, and can comprise similar materials listed above for spacer 711.

In some embodiments, layer 703 is on metal layer 3 (M3), capacitor 701 is on metal layer 4 (M4, and transistor 702 is on metal layer 5 (M5). In this example, the memory cell is formed between M4 and M5.

FIG. 8 illustrates another cross-section 800 (of cut BB') of the ferroelectric memory cell of FIG. 6, in accordance with some embodiments. The layers here are the same as those of FIG. 7, but showing from another perspective (x-z plane). In some embodiments, layer 812 is a metal via coupled to the gate layer 710. In some embodiments, layer 813 is a metal routing layer coupled to via 812. In some embodiments, elements 813 and 182 are used to route the word-line signal to element 710.

Figure 9:
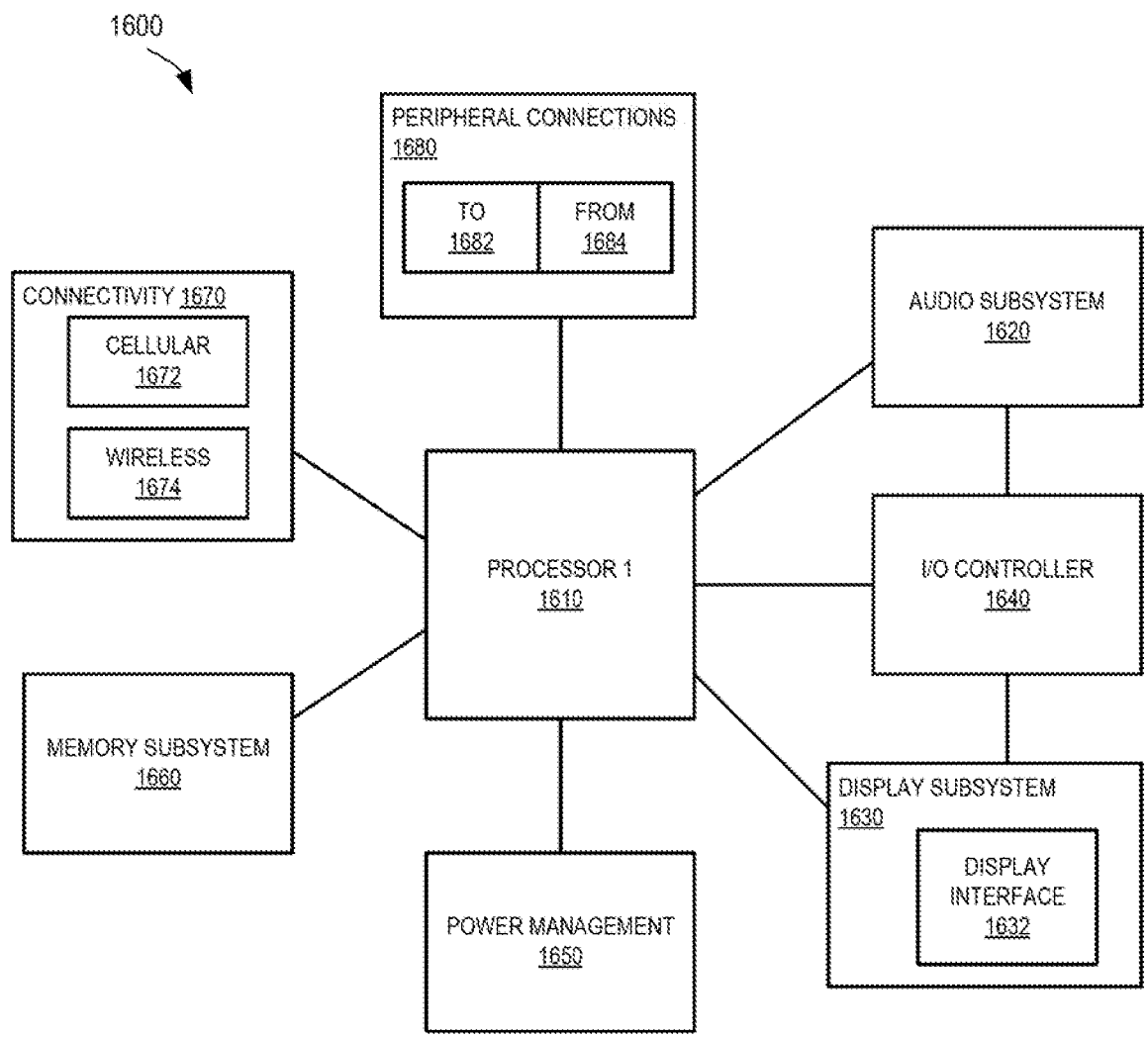
FIG. 9 illustrates a smart device or a computer system or a System-on-Chip (SoC) with a memory comprising ferroelectric capacitors and vertical backend transistor or backend transistors, according to some embodiments.

FIG. 9 illustrates a smart device or a computer system or a System-on-Chip (SoC) with a memory comprising ferroelectric capacitors and vertical backend transistor or backend transistors, according to some embodiments. FIG. 9 illustrates a block diagram of an embodiment of a mobile device in which flat surface interface connectors could be used. In some embodiments, computing device 1600 represents a mobile computing device, such as a computing tablet, a mobile phone or smart-phone, a wireless-enabled e-reader, or other wireless mobile device. It will be understood that certain components are shown generally, and not all components of such a device are shown in computing device 1600.

In some embodiments, computing device 1600 includes a first processor 1610 with an imprint-free write driver, according to some embodiments discussed. Other blocks of the computing device 1600 may also include an imprint-free write driver, according to some embodiments. The various embodiments of the present disclosure may also comprise a network interface within 1670 such as a wireless interface so that a system embodiment may be incorporated into a wireless device, for example, cell phone or personal digital assistant.

In one embodiment, processor 1610 (and/or processor 1690) can include one or more physical devices, such as microprocessors, application processors, microcontrollers, programmable logic devices, or other processing means. The processing operations performed by processor 1610 include the execution of an operating platform or operating system on which applications and/or device functions are executed. The processing operations include operations related to I/O (input/output) with a human user or with other devices, operations related to power management, and/or operations related to connecting the computing device 1600 to another device. The processing operations may also include operations related to audio I/O and/or display I/O.

In one embodiment, computing device 1600 includes audio subsystem 1620, which represents hardware (e.g., audio hardware and audio circuits) and software (e.g., drivers, codecs) components associated with providing audio functions to the computing device. Audio functions can include speaker and/or headphone output, as well as microphone input. In some embodiments, audio subsystem 1620 includes apparatus and/or machine executable instructions to avoid self-hearing, according to some embodiments. Devices for such functions can be integrated into computing device 1600, or connected to the computing device 1600. In one embodiment, a user interacts with the computing device 1600 by providing audio commands that are received and processed by processor 1610.

Display subsystem 1630 represents hardware (e.g., display devices) and software (e.g., drivers) components that provide a visual and/or tactile display for a user to interact with the computing device 1600. Display subsystem 1630 includes display interface 1632, which includes the particular screen or hardware device used to provide a display to a user. In one embodiment, display interface 1632 includes logic separate from processor 1610 to perform at least some processing related to the display. In one embodiment, display subsystem 1630 includes a touch screen (or touch pad) device that provides both output and input to a user.

I/O controller 1640 represents hardware devices and software components related to interaction with a user. I/O controller 1640 is operable to manage hardware that is part of audio subsystem 1620 and/or display subsystem 1630. Additionally, I/O controller 1640 illustrates a connection point for additional devices that connect to computing device 1600 through which a user might interact with the system. For example, devices that can be attached to the computing device 1600 might include microphone devices, speaker or stereo systems, video systems or other display devices, keyboard or keypad devices, or other I/O devices for use with specific applications such as card readers or other devices.

As mentioned above, I/O controller 1640 can interact with audio subsystem 1620 and/or display subsystem 1630. For example, input through a microphone or other audio device can provide input or commands for one or more applications or functions of the computing device 1600. Additionally, audio output can be provided instead of, or in addition to display output. In another example, if display subsystem 1630 includes a touch screen, the display device also acts as an input device, which can be at least partially managed by I/O controller 1640. There can also be additional buttons or switches on the computing device 1600 to provide I/O functions managed by I/O controller 1640.

In one embodiment, I/O controller 1640 manages devices such as accelerometers, cameras, light sensors or other environmental sensors, or other hardware that can be included in the computing device 1600. The input can be part of direct user interaction, as well as providing environmental input to the system to influence its operations (such as filtering for noise, adjusting displays for brightness detection, applying a flash for a camera, or other features).

In one embodiment, computing device 1600 includes power management 1650 that manages battery power usage, charging of the battery, and features related to power saving operation. Memory subsystem 1660 includes memory devices for storing information in computing device 1600. Memory can include nonvolatile (state does not change if power to the memory device is interrupted) and/or volatile (state is indeterminate if power to the memory device is interrupted) memory devices. Memory subsystem 1660 can store application data, user data, music, photos, documents, or other data, as well as system data (whether long-term or temporary) related to the execution of the applications and functions of the computing device 1600. In some embodiments, memory subsystem 1660 comprises ferroelectric capacitors and vertical backend transistor or backend transistors.

Elements of embodiments are also provided as a machine-readable medium (e.g., memory 1660) for storing the computer-executable instructions (e.g., instructions to implement any other processes discussed herein). The machine-readable medium (e.g., memory 1660) may include, but is not limited to, flash memory, optical disks, CD-ROMs, DVD ROMs, RAMs, EPROMs, EEPROMs, magnetic or optical cards, phase change memory (PCM), or other types of machine-readable media suitable for storing electronic or computer-executable instructions. For example, embodiments of the disclosure may be downloaded as a computer program (e.g., BIOS) which may be transferred from a remote computer (e.g., a server) to a requesting computer (e.g., a client) by way of data signals via a communication link (e.g., a modem or network connection).

Connectivity 1670 includes hardware devices (e.g., wireless and/or wired connectors and communication hardware) and software components (e.g., drivers, protocol stacks) to enable the computing device 1600 to communicate with external devices. The computing device 1600 could be separate devices, such as other computing devices, wireless access points or base stations, as well as peripherals such as headsets, printers, or other devices.

Connectivity 1670 can include multiple different types of connectivity. To generalize, the computing device 1600 is illustrated with cellular connectivity 1672 and wireless connectivity 1674. Cellular connectivity 1672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, or other cellular service standards. Wireless connectivity (or wireless interface) 1674 refers to wireless connectivity that is not cellular, and can include personal area networks (such as Bluetooth, Near Field, etc.), local area networks (such as Wi-Fi), and/or wide area networks (such as WiMax), or other wireless communication.

Peripheral connections 1680 include hardware interfaces and connectors, as well as software components (e.g., drivers, protocol stacks) to make peripheral connections. It will be understood that the computing device 1600 could be a peripheral device ("to" 1682) to other computing devices, as well as have peripheral devices ("from" 1684) connected to it. The computing device 1600 commonly has a "docking" connector to connect to other computing devices for purposes such as managing (e.g., downloading and/or uploading, changing, synchronizing) content on computing device 1600. Additionally, a docking connector can allow computing device 1600 to connect to certain peripherals that allow the computing device 1600 to control content output, for example, to audiovisual or other systems.

In addition to a proprietary docking connector or other proprietary connection hardware, the computing device 1600 can make peripheral connections 1680 via common or standards-based connectors. Common types can include a Universal Serial Bus (USB) connector (which can include any of a number of different hardware interfaces), DisplayPort including MiniDisplayPort (MDP), High Definition Multimedia Interface (HDMI), Firewire, or other types.

Reference in the specification to "an embodiment," "one embodiment," "some embodiments," or "other embodiments" means that a particular feature, structure, or characteristic described in connection with the embodiments is included in at least some embodiments, but not necessarily all embodiments. The various appearances of "an embodiment," "one embodiment," or "some embodiments" are not necessarily all referring to the same embodiments. If the specification states a component, feature, structure, or characteristic "may," "might," or "could" be included, that particular component, feature, structure, or characteristic is not required to be included. If the specification or claim refers to "a" or "an" element, that does not mean there is only one of the elements. If the specification or claims refer to "an additional" element, that does not preclude there being more than one of the additional element.

Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

While the disclosure has been described in conjunction with specific embodiments thereof, many alternatives, modifications and variations of such embodiments will be apparent to those of ordinary skill in the art in light of the foregoing description. For example, other memory architectures e.g., Dynamic RAM (DRAM) may use the embodiments discussed. The embodiments of the disclosure are intended to embrace all such alternatives, modifications, and variations as to fall within the broad scope of the appended claims.

In addition, well known power/ground connections to integrated circuit (IC) chips and other components may or may not be shown within the presented figures, for simplicity of illustration and discussion, and so as not to obscure the disclosure. Further, arrangements may be shown in block diagram form in order to avoid obscuring the disclosure, and also in view of the fact that specifics with respect to implementation of such block diagram arrangements are highly dependent upon the platform within which the present disclosure is to be implemented (i.e., such specifics should be well within purview of one skilled in the art). Where specific details (e.g., circuits) are set forth in order to describe example embodiments of the disclosure, it should be apparent to one skilled in the art that the disclosure can be practiced without, or with variation of, these specific details. The description is thus to be regarded as illustrative instead of limiting.

The following examples pertain to further embodiments. Specifics in the examples may be used anywhere in one or more embodiments. All optional features of the apparatus described herein may also be implemented with respect to a method or process.

Example 1

An apparatus comprising: a word line; a source line; a bit-line; and a memory bit-cell coupled to the source line, the bit-line, and the word line, wherein the memory bit-cell comprises a capacitor including ferroelectric material and a transistor fabricated on a backend of a die.

Example 2

The apparatus of example 1, wherein the transistor is a vertical transistor relative to a transistor on a frontend of the die.

Example 3

The apparatus of example 1 comprises peripheral circuitry coupled to the memory bit-cell, wherein the peripheral circuitry comprises transistors positioned on the frontend of the die.

Example 4

The apparatus of example 1, wherein the capacitor is positioned directly above the transistor.

Example 5

The apparatus of example 1, wherein the capacitor is positioned directly below the transistor.

Example 6

The apparatus of example 1, wherein the transistor is a nanowire transistor.

Example 7

The apparatus of example 2, wherein the ferroelectric capacitor includes: a first layer comprising metal; a second layer comprising metal; and a third layer comprising a ferroelectric material, the third layer between the first and second layers.

Example 8

The apparatus of example 7, wherein the first and second layers include one of: Sr, Ru, La, Sr, Mn, Nb, Cr, or O.

Example 9

The apparatus of example 7, wherein the first and second layers include one of: $SrRuO_3$, $(La,Sr)CoO_3$ [LSCO], $La_{0.5}Sr_{0.5}Mn_{1-x}Ni_xO$, Cu-doped $SrFe_{0.9}Nb_{0.1}O_3$, or $(La,Sr)CrO_3$.

Example 10

The apparatus of example 7, wherein the third layer includes one of: Hf, Zr, Sr, Ti, O, Bi, Fe, or Ba.

Example 11

The apparatus of example 7, wherein the third layer includes one of: TiAl, Nb doped $SrTiO_3$ (STO), La doped STO, STO, $BiFeO_3$ (BFO), $BiTeO_3$, $BaTiO_3$ (BTO), or $HfZrO_2$ (HZO).

Example 12

The apparatus of example 7, wherein third layer has a thickness in a range of 50 A to 110 A.

Example 13

The apparatus of example 7, wherein the third layer includes a super lattice of $PbTiO_3$ (PTO) and $SrTiO_3$ (STO).

Example 14

The apparatus of example 13, wherein the super lattice of PTO and STO are repeated in a range of 2 to 100 times.

Example 15

The apparatus of example 1, wherein the transistor is coupled to a word-line.

Example 16

A system comprising: a processor; a memory coupled to the processor, the memory according to any one of apparatus examples 1 to 15; and a wireless interface to allow the processor to communicate with another device.

Example 17

An apparatus comprising: a first layer comprising metal and coupled to a bit-line; a second layer comprising oxygen and nitrogen, the second layer adjacent to the first layer; a gate adjacent to the second layer; a third layer comprising oxygen and nitrogen, the third layer adjacent to the gate; a fourth layer adjacent to the third layer, the fourth layer comprising a channel region controllable by the gate; a fifth layer comprising metal, the fifth layer adjacent to the fourth layer; a capacitor comprising ferroelectric material, the capacitor adjacent to the fifth layer; a sixth layer comprising metal, the sixth layer adjacent to the capacitor; and a seventh layer comprising metal, the seventh layer adjacent the sixth layer and coupled to a source line.

Example 18

The apparatus of example 17, wherein the ferroelectric material comprises includes one of: Ti, Al, Nb, La, or $SrTiO_3$ (STO).

Example 19

The apparatus of example 17, wherein the ferroelectric material includes one of: TiAl, Nb doped $SrTiO_3$ (STO), La doped STO, STO, $BiFeO_3$ (BFO), $BiTeO_3$, $BaTiO_3$ (BTO), or $HfZrO_2$ (HZO).

Example 20

The apparatus of example 17, wherein the ferroelectric material includes a super lattice of $PbTiO_3$ (PTO) and $SrTiO_3$ (STO).

Example 21

The apparatus according to any one of examples 17 to 20, wherein the metal of the first layer includes one of: N, Ta, Cu, W, Al, Au, Ag, Co, TiN, TaN, or Graphene.

Example 22

The apparatus according to any one of examples 17 to 20, wherein the metal of the seventh layer includes one of: N, Ta, Cu, W, Al, Au, Ag, Co, TiN, TaN, or Graphene.

Example 23

The apparatus according to any one of examples 17 to 20, wherein the capacitor and gate are positioned in a backend of a die.

Example 24

The apparatus according to any one of examples 17 to 20, wherein the fourth layer comprising the channel region includes poly silicon.

Example 25

A system comprising: a processor; a memory coupled to the processor, the memory according to any one of apparatus examples 17 to 24; and a wireless interface to allow the processor to communicate with another device.

Example 26

A method comprising: forming a word line; forming a source line; forming a bit-line; and forming a memory bit-cell coupled to the source line, the bit-line, and the word line, wherein the memory bit-cell comprises a capacitor including ferroelectric material and a transistor fabricated on a backend of a die.

Example 27

The method of example 26, wherein the transistor is a vertical transistor relative to a transistor on a frontend of the die.

Example 28

The method of example 26 comprises coupling a peripheral circuitry to the memory bit-cell, wherein the peripheral circuitry comprises transistors positioned on the frontend of the die.

Example 29

The method of example 26 comprising forming the capacitor directly above the transistor.

Example 30

The method of example 26 comprising forming the capacitor directly below the transistor.

Example 31

The method of example 26, wherein the transistor is a nanowire transistor.

Example 32

A method comprising: forming a first layer comprising metal and coupled to a bit-line; forming a second layer comprising oxygen and nitrogen, the second layer adjacent to the first layer; forming a gate adjacent to the second layer; forming a third layer comprising oxygen and nitrogen, the third layer adjacent to the gate; forming a fourth layer adjacent to the third layer, the fourth layer comprising a channel region controllable by the gate; forming a fifth layer comprising metal, the fifth layer adjacent to the fourth layer; forming a capacitor comprising ferroelectric material, the capacitor adjacent to the fifth layer; forming a sixth layer comprising metal, the sixth layer adjacent to the capacitor; and forming a seventh layer comprising metal, the seventh layer adjacent the sixth layer and coupled to a source line.

Example 33

The method of example 32, wherein the ferroelectric material comprises includes one of: Ti, Al, Nb, La, or $SrTiO_3$ (STO).

Example 34

The method of example 32, wherein the ferroelectric material includes one of: TiAl, Nb doped $SrTiO_3$ (STO), La doped STO, STO, $BiFeO_3$ (BFO), $BiTeO_3$, $BaTiO_3$ (BTO), or $HfZrO_2$ (HZO).

Example 35

The method of example 34, wherein the ferroelectric material includes a super lattice of $PbTiO_3$ (PTO) and $SrTiO_3$ (STO).

Example 36

The method according to any one of examples 32 to 35, wherein the metal of the first layer includes one of: N, Ta, Cu, W, Al, Au, Ag, Co, TiN, TaN, or Graphene.

Example 37

The method according to any one of examples 32 to 35, wherein the metal of the seventh layer includes one of: N, Ta, Cu, W, Al, Au, Ag, Co, TiN, TaN, or Graphene.

Example 38

The method according to any one of examples 32 to 35, wherein the capacitor and gate are positioned in a backend of a die.

Example 39

The method according to any one of examples 32 to 35, wherein the fourth layer comprising the channel region includes poly silicon.

An abstract is provided that will allow the reader to ascertain the nature and gist of the technical disclosure. The abstract is submitted with the understanding that it will not be used to limit the scope or meaning of the claims. The following claims are hereby incorporated into the detailed description, with each claim standing on its own as a separate embodiment.

We claim:
1. An apparatus comprising:
   a word line;
   a source line;
   a bit-line; and
   a memory bit-cell coupled to the source line, the bit-line, and the word line, wherein the memory bit-cell comprises:
      a capacitor comprising:
         a first conductive contact structure, and a second conductive contact structure;
         a first body of a first conductive oxide;
         a second body of a second conductive oxide; and
         a third body comprising a ferroelectric material;
      wherein:
         the first body, the second body, and the third body each extend in a via structure between the first conductive contact structure and the second conductive contact structure;
in the via structure, the first body extends around and adjoins the third body, and the third body extends around and adjoins the second body;
of the first body, the second body, and the third body, only the first body extends to the first conductive contact structure; and
the second body and the third body each extend to the second conductive contact structure; and
a transistor fabricated on a backend of a die, the transistor comprising:
a first source or drain region;
a second source or drain region; and
a channel region extending vertically between the first source or drain region, and the second source or drain region;
wherein the capacitor is aligned vertically above or below both the first source or drain region, and the channel region; and
wherein the capacitor is coupled to the transistor via the first source or drain region.

2. The apparatus of claim 1, wherein the first conductive contact structure adjoins the first source or drain region.

3. The apparatus of claim 1, further comprising peripheral circuitry coupled to the memory bit-cell, wherein the peripheral circuitry comprises transistors positioned on the frontend of the die.

4. The apparatus of claim 1, wherein the capacitor is positioned directly above the transistor.

5. The apparatus of claim 1, wherein the capacitor is positioned directly below the transistor.

6. The apparatus of claim 1, wherein the transistor is a nanowire transistor.

7. The apparatus of claim 2, wherein the capacitor further comprises an electrode structure which extends from the second conductive contact structure, wherein, in the via structure, the first body, the second body and the third body each extend around the electrode structure.

8. The apparatus of claim 7, wherein the first conductive oxide and the second conductive oxide each comprise a respective one of: Sr, Ru, La, Sr, Mn, Nb, Cr, or O.

9. The apparatus of claim 7, wherein the first conductive oxide and the second conductive oxide each comprise a respective one of: $SrRuO_3$, $(La,Sr)CoO_3$ [LSCO], $La_{0.5}Sr_{0.5}Mn_{1-x}Ni_xO$, Cu-doped $SrFe_{0.9}Nb_{0.1}O_3$, or $(La,Sr)CrO_3$.

10. The apparatus of claim 7, wherein the third body comprises one of: Hf, Zr, Sr, Ti, O, Bi, Fe, or Ba.

11. The apparatus of claim 7, wherein the third body comprises one of: TiAl, Nb doped $SrTiO_3$ (STO), La doped STO, STO, $BiFeO_3$ (BFO), $BiTeO_3$, $BaTiO_3$ (BTO), or $HfZrO_2$ (HZO).

12. The apparatus of claim 7, wherein a thickness of the third body is in a range of 50 A to 110 A.

13. The apparatus of claim 7, wherein the third body comprises a super lattice of $PbTiO_3$ (PTO) and $SrTiO_3$ (STO).

14. The apparatus of claim 13, wherein the super lattice of PTO and STO are repeated in a range of 2 to 100 times.

15. The apparatus of claim 1, wherein the transistor is coupled to the word line.

16. A system comprising:
a processor;
a memory coupled to the processor, the memory comprising:
a word line;
a source line;
a bit-line; and
a memory bit-cell coupled to the source line, the bit-line, and the word line, wherein the memory bit-cell comprises:
a capacitor comprising:
a first conductive contact structure, and a second conductive contact structure;
a first body of a first conductive oxide;
a second body of a second conductive oxide; and
a third body comprising a ferroelectric material;
wherein:
the first body, the second body, and the third body each extend in a via structure between the first conductive contact structure and the second conductive contact structure;
in the via structure, the first body extends around and adjoins the third body, and the third body extends around and adjoins the second body;
of the first body, the second body, and the third body, only the first body extends to the first conductive contact structure; and
the second body and the third body each extend to the second conductive contact structure; and
a transistor fabricated on a backend of a die, the transistor comprising:
a first source or drain region;
a second source or drain region; and
a channel region extending vertically between the first source or drain region, and the second source or drain region;
wherein the capacitor is aligned vertically above or below both the first source or drain region, and the channel region; and
wherein the capacitor is coupled to the transistor via the first source or drain region; and
a wireless interface to allow the processor to communicate with another device.

17. The system of claim 16, wherein the first conductive contact structure adjoins the first source or drain region.

18. The system of claim 16, further comprising peripheral circuitry coupled to the memory bit-cell, wherein the peripheral circuitry comprises transistors positioned on the frontend of the die.

19. An apparatus comprising:
a first layer comprising a first metal and coupled to a bit-line;
a second layer comprising oxygen and nitrogen, the second layer adjacent to the first layer;
a gate of a transistor, wherein the gate is adjacent to the second layer;
a third layer comprising oxygen and nitrogen, the third layer adjacent to the gate;
a fourth layer adjacent to the third layer, the fourth layer comprising a channel region of the transistor, wherein the channel region is controllable by the gate;
a capacitor comprising;
a fifth layer comprising a second metal, the fifth layer adjacent to the fourth layer;
a sixth layer comprising a third metal;
a first body of a first conductive oxide;
a second body of a second conductive oxide; and
a third body comprising a ferroelectric material;
wherein:
the first body, the second body, and the third body each extend in a via structure between the fifth layer and the sixth layer;

in the via structure, the first body extends around and adjoins the third body, and the third body extends around and adjoins the second body;

of the first body, the second body, and the third body, only the first body extends to the fifth layer; and the second body and the third body each extend to the sixth layer; and a seventh layer comprising a fourth metal, the seventh layer adjacent the sixth layer and coupled to a source line;

wherein the transistor comprises a first source or drain region, and a second source or drain region, wherein the channel region extends vertically between the first source or drain region, and the second source or drain region;

wherein the capacitor is aligned vertically above or below both the first source or drain region, and the channel region; and wherein the capacitor is coupled to the transistor via the first source or drain region.

20. The apparatus of claim 19, wherein the ferroelectric material comprises one of: Ti, Al, Nb, La, or $SrTiO_3$ (STO).

21. The apparatus of claim 19, wherein the ferroelectric material comprises one of: TiAl, Nb doped $SrTiO_3$ (STO), La doped STO, STO, $BiFeO_3$ (BFO), $BiTeO_3$, $BaTiO_3$ (BTO), or $HfZrO_2$ (HZO).

22. The apparatus of claim 19, wherein the ferroelectric material comprises a super lattice of $PbTiO_3$ (PTO) and $SrTiO_3$ (STO).

23. The apparatus of claim 19, wherein the first metal of the first layer comprises one of: N, Ta, Cu, W, Al, Au, Ag, Co, TiN, TaN, or Graphene.

24. The apparatus of claim 19, wherein the fourth metal of the seventh layer comprises one of: N, Ta, Cu, W, Al, Au, Ag, Co, TiN, TaN, or Graphene.

25. The apparatus of claim 19, wherein the capacitor and gate are positioned in a backend of a die.

26. The apparatus of claim 19, wherein the fourth layer comprising the channel region comprises poly silicon.

\* \* \* \* \*